(12) United States Patent
Feng et al.

(10) Patent No.: US 10,230,394 B2
(45) Date of Patent: Mar. 12, 2019

(54) METHODS FOR COMPRESSING AND DECOMPRESSING IQ DATA, AND ASSOCIATED DEVICES

(71) Applicant: Telefonaktiebolaget LM Ericsson (publ), Stockholm (SE)

(72) Inventors: Ang Feng, Beijing (CN); Chen Wang, Beijing (CN); Jinsong Yang, Beijing (CN)

(73) Assignee: Telefonaktiebolaget LM Ericsson (Publ), Stockholm (SE)

( * ) Notice: Subject to any disclaimer, the term of this patent is extended or adjusted under 35 U.S.C. 154(b) by 0 days.

(21) Appl. No.: 15/509,254

(22) PCT Filed: Sep. 19, 2014

(86) PCT No.: PCT/CN2014/086958
§ 371 (c)(1),
(2) Date: Mar. 7, 2017

(87) PCT Pub. No.: WO2016/041204
PCT Pub. Date: Mar. 24, 2016

(65) Prior Publication Data
US 2017/0288695 A1    Oct. 5, 2017

(51) Int. Cl.
*H03M 7/50* (2006.01)
*H03M 7/30* (2006.01)
*H04B 1/66* (2006.01)

(52) U.S. Cl.
CPC ........... *H03M 7/50* (2013.01); *H03M 7/3082* (2013.01); *H04B 1/66* (2013.01)

(58) Field of Classification Search
CPC .......... H03M 7/50; H03M 7/3082; H04B 1/66
See application file for complete search history.

(56) References Cited

U.S. PATENT DOCUMENTS

| | | | |
|---|---|---|---|
| 2004/0015349 A1* | 1/2004 | Vinton | G10L 19/02 704/230 |
| 2007/0211804 A1* | 9/2007 | Haupt | H03M 7/3046 375/242 |

(Continued)

FOREIGN PATENT DOCUMENTS

| | | |
|---|---|---|
| CN | 101005474 | 7/2007 |
| CN | 101932002 | 12/2010 |

(Continued)

OTHER PUBLICATIONS

A New IQ Data Compression Scheme for Front-Haul Link in Centralized RAN; 2013 IEEE 24th International Symposium on Personal, Indoor and Mobile Radio Communications: Workshop on Cooperative and Heterogeneous Cellular Networks by Shinobu Nanba and Akira Agata—2013.

(Continued)

*Primary Examiner* — Syed Haider
(74) *Attorney, Agent, or Firm* — Patent Portfolio Builders, PLLC

(57) ABSTRACT

A method for compressing IQ data for high speed transport link and an associated device. The method comprises: determining, based on dynamical statistical distribution of the IQ data, one or more parameters of a companding function for a nonlinear companding operation (S310); applying the companding function with the determined one or more parameters on the IQ data (S320); performing uniform quantization on the IQ data to generate compressed IQ data (S330); and transmitting the compressed IQ (S340). And a method for decompressing compressed IQ data for high speed transport link, and an associated device.

18 Claims, 10 Drawing Sheets

(56) References Cited

U.S. PATENT DOCUMENTS

| | | | |
|---|---|---|---|
| 2009/0051426 A1* | 2/2009 | Ba | H03F 1/3247 330/149 |
| 2010/0106269 A1* | 4/2010 | Garudadri | G10L 19/032 700/94 |
| 2010/0191538 A1* | 7/2010 | Kovesi | G10L 19/24 704/500 |
| 2011/0135013 A1 | 6/2011 | Wegener | |
| 2013/0282386 A1* | 10/2013 | Vilermo | G10L 19/008 704/500 |
| 2016/0248455 A1* | 8/2016 | Dhanasekaran | H03F 1/305 |
| 2017/0238361 A1* | 8/2017 | Pawar | H04W 88/085 455/561 |

FOREIGN PATENT DOCUMENTS

| | | | |
|---|---|---|---|
| CN | 102255692 | | 11/2011 |
| CN | 102255692 A | * | 11/2011 |
| CN | 103731842 | | 4/2014 |
| CN | 103812818 | | 5/2014 |
| FR | 2 935 077 A1 | | 2/2010 |
| WO | WO 2014134805 | | 9/2014 |

OTHER PUBLICATIONS

Compressed Transport of Baseband Signals in Radio Access Networks; IEEE Transactions on Wireless Communications, vol. 11, No. 9 by Dragan Samardzija et al.—Sep. 2012

PCT Notification of Transmittal of the International Search Report and the Written Opinion of the International Searching Authority, or the Declaration for International application No. PCT/CN2014/086958—dated Jun. 19, 2015

Anonymous: "Companding", Wikipedia; retrieved from Internet on Apr. 5, 2018-May 25, 2014.

Extended European Search Report for Application No./Patent No. 14902017.4-1207 / 3195507 PCT/CN2014086958—dated Apr. 23, 2018.

\* cited by examiner

METHODS FOR COMPRESSING AND DECOMPRESSING IQ DATA, AND ASSOCIATED DEVICES

PRIORITY

This nonprovisional application is a U.S. National Stage Filing under 35 U.S.C. § 371 of International Patent Application Serial No. PCT/CN2014/086958 filed Sep. 19, 2014, and entitled "Methods For Compressing And Decompressing IQ Data, And Associated Devices."

TECHNICAL FIELD

The technology presented in this disclosure generally relates to the technical field of wireless communication networks. More particularly, the present disclosure relates to a method for compressing IQ (In-phase and Quadrature) data for high speed transport link and an associated device, and to a method for decompressing compressed IQ data for high speed transport link and an associated device.

BACKGROUND

This section is intended to provide a background to the various embodiments of the technology described in this disclosure. The description in this section may include concepts that could be pursued, but are not necessarily ones that have been previously conceived or pursued. Therefore, unless otherwise indicated herein, what is described in this section is not prior art to the description and/or claims of this disclosure and is not admitted to be prior art by the mere inclusion in this section.

In the wireless communication system, the explosive growth of wireless data traffic requires more capacity of transport links such as those specified by the existing industry standards for modular designs, e.g., Common Public Radio Interface (CPRI), Open Base Station Architecture Initiative (OBSAI), JESD204B, etc. CPRI refers to serial data links between a Remote Radio Head (RRH, also known as Radio Unit (RU)) and a Baseband Unit (BBU, also known as Digital Unit (DU) or Radio Element Controller (REC)). OBSAI mainly describes architectures and protocols for communication between base station processors, referred to as baseband modules, and RF modules. JESD204B refers to a JEDEC Standard for serial interface for data converter including, e.g., Analog-Digital Converter (ADC) or Digital-Analog Converter (DAC).

Such transport links cannot keep up with fast growing trend of wireless data traffic and becomes a bottleneck of the wireless communication system. One solution is to increase the link speed, for example, from 10G CPRI to 40G or 100G CPRI. This solution makes the cost eventually unaffordable because the growth of money is much more than the growth of link rate. Another solution is to utilize multiple links. Besides increasing the cost, this solution also makes the deployment more difficult (double fibers, Small Form Pluggables (SFPs) and accessories) and may prevent cascading connection.

SUMMARY

It is in view of the above considerations and others that the various embodiments of the present technology have been made. To be specific, aiming to at least some of the above defects, the present disclosure proposes an IQ data compression scheme for high speed transport link by applying nonlinear companding.

According to a first aspect of the present disclosure, there is proposed a method for compressing IQ data for high speed transport link. The method includes: determining, based on dynamical statistical distribution of the IQ data, one or more parameters of a companding function for a nonlinear companding operation; applying the companding function with the determined one or more parameters on the IQ data; performing uniform quantization on the IQ data to generate compressed IQ data; and transmitting the compressed IQ data and the companding function with the determined one or more parameters.

Preferably, determining the one or more parameters of the companding function comprises: determining the one or more parameters of the companding function by applying curve fitting, and the curve fitting is made based on the dynamical statistical distribution of the IQ data.

Preferably, the companding function includes at least one of: μ-law, A-law, error function, tan h function, or logarithmic function.

Preferably, the nonlinear companding operation includes a nonlinear asymmetrical transform (NLAST) companding operation or a nonlinear symmetrical transform (NLST) companding operation.

Preferably, the method is applied in a BBU or a RRH.

According to a second aspect of the present disclosure, there is proposed a method for decompressing compressed IQ data for high speed transport link. The method includes: receiving compressed IQ data and a companding function with one or more parameters thereof for a nonlinear companding operation, the one or more parameters being determined based on dynamical statistical distribution of IQ data from which the compressed IQ data are originated; performing uniform de-quantization on the compressed IQ data; and applying an inverse operation of the nonlinear companding operation to generate the IQ data.

According to a third aspect of the present disclosure, there is proposed a device for compressing IQ data for high speed transport link. The device includes: a determining unit configured to determine, based on dynamical statistical distribution of the IQ data, one or more parameters of a companding function for a nonlinear companding operation; a companding unit configured to apply the companding function with the determined one or more parameters on the IQ data; a quantization unit configured to perform uniform quantization on the IQ data to generate compressed IQ data; and a transmitting unit configured to transmit the compressed IQ data and the companding function with the determined one or more parameters.

According to a fourth aspect of the present disclosure, there is proposed a device for decompressing compressed IQ data for high speed transport link. The device includes: a receiving unit configured to receive compressed IQ data and a companding function with one or more parameters thereof for a nonlinear companding operation, the one or more parameters being determined based on dynamical statistical distribution of IQ data from which the compressed IQ data are originated; a de-quantization unit configured to perform uniform de-quantization on the compressed IQ data; and a companding unit configured to apply an inverse operation of the nonlinear companding operation to generate the IQ data.

According to a fifth aspect of the present disclosure, there is proposed a computer program product storing instructions that when executed, cause one or more computing devices to perform the method according to any of the first to the fourth aspects of the present disclosure.

By applying the IQ data compression and decompression based on the nonlinear companding, the present disclosure can achieve more capacity for high speech transport link while reducing realization complexity.

BRIEF DESCRIPTION OF THE DRAWINGS

The foregoing and other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

DETAILED DESCRIPTION OF EMBODIMENTS

Figure 1:
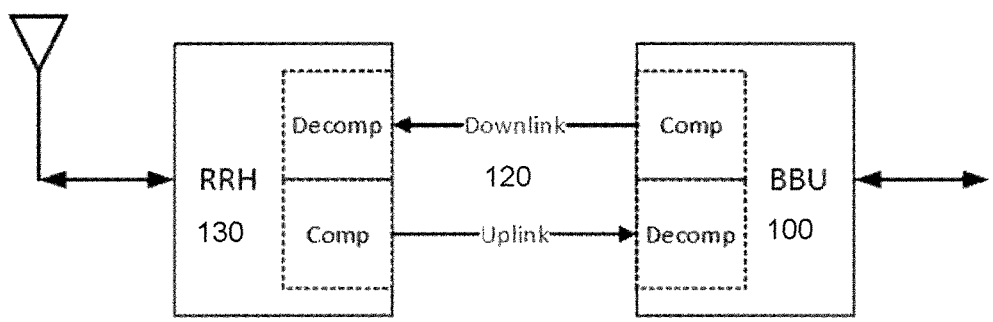
FIG. 1 is a block diagram of a general base station architecture that incorporates compression and decompression in which the present disclosure may be applied.

Hereinafter, the present disclosure is described with reference to embodiments shown in the attached drawings. However, it is to be understood that those descriptions are just provided for illustrative purpose, rather than limiting the present disclosure. Further, in the following, descriptions of known structures and techniques are omitted so as not to unnecessarily obscure the concept of the present disclosure.

IQ data compression has been introduced to compromise between the cost and the capacity in the transport links as mentioned in the above (see, e.g., US2011/0135013A1). To be specific, IQ data compression is employed to compress IQ data to be transmitted over the transport links, so as to improve the capacity of the transport links. IQ data herein generally refers to a sequence of signal samples, wherein each signal sample includes an in-phase (I) sample and a quadrature (Q) sample.

The existing technologies on IQ data compression may be mainly categorized into time-domain compression and frequency-domain compression. In frequency-domain compression, IQ data transmitted in the transport link are frequency-domain symbols. That is, either Inverse Fast Fourier Transform (IFFT) and adding CP in downlink scenario, or Fast Fourier Transform (FFT) and removing CP in uplink scenario, are moved from DU into RU. In time-domain compression, the data transmitted in the transport link are still time-domain samples, but with less redundancy. This scheme includes source coding, quantization, Automatic Gain Control (AGC), and resampling. For example, the source coding applies Huffman codes to each sample. The uniform quantization simply drops some bits of each sample, while non-uniform quantization utilizes Lloyd-Max algorithm to minimize quantization error (see D. Samardzija, J. Pastalan, M. MacDonald, S. Walker, and R. Valen-zuela, "Compressed transport of baseband signals in radio access networks," IEEE Transactions on Wireless Communications, vol. 11, no. 9, pp. 3216-3225, 2012). The AGC, also known as scaling, depresses the dynamic range of IQ data, generally used with quantization. The resampling exploits the guard band to decrease the redundancy between samples.

The resampling might lead to performance loss even if the down-sample rate is conforming to Nyquist theory. The uniform quantization leads to significant Error Vector Magnitude (EVM) deterioration if the compression rate is high. The non-uniform quantization has unacceptable complexity because of Lloyd-Max algorithm. The AGC has process delay relating to the block size. They also need transmitting partitions, codebook, and scaling factor, thus lower the transmission rate (see S. Nanba and A. Agata, "A new IQ data compression scheme for front-haul link in Centralized RAN," in 2013 IEEE 24th International Symposium on Personal, Indoor and Mobile Radio Communications (PIMRC Workshops), 2013, pp. 210-214). Due to using shorter code for higher possible sample, the source coding may lead to the compression rate uncontrollable. The complexity of frequency domain compression is much higher than time domain compression, because blocks IFFF/FFT and adding/removing CP are all placed in RU. In addition, this issue may be worse since the RACH should be moved into RU too to find the radio frame head.

The present disclosure provides an improved IQ data compression, in which nonlinear companding and uniform quantization are used instead of non-uniform quantization in the existing technology, so as to achieve more capacity of high speed transport link while reducing realization complexity.

In telecommunication and signal processing, companding (occasionally called compansion) is a method of mitigating the detrimental effects of a channel with limited dynamic range. The name is a portmanteau of compressing and expanding. The use of companding allows signals with a large dynamic range to be transmitted over facilities that have a smaller dynamic range capability. Companding is typically employed in telephony and other audio applications such as professional wireless microphones and analog recording. In practice, companding is usually designed to operate according to relatively simple dynamic range compressor functions that are designed to be suitable for implementation using simple analog electronic circuits. The two most popular companding functions used for telecommunications are the A-law and μ-law functions, which are mainly used for compressing voice having relatively fixed distribution.

FIG. 1 is a block diagram of a general base station architecture that incorporates compression and decompression in which the present disclosure may be applied. The architecture includes a BBU 100 connected by one or more transport links 120 to a RRH 130. This general architecture can be used for any air interface standard employed by wireless communication network, including GSM/EDGE, CDMA based modulation formats, OFDM based modulation formats such as LTE and other signal modulation formats that may evolve. The transport link 120 can be implemented by fiber optic, coaxial cable or RJ-45 twisted pair. The BBU 100 performs signal processing functions to prepare data for transmission by the RRH 130 or recover data from signal samples received from the RRH 130. The types of functions include symbol modulation/demodulation, channel encoding/decoding, spreading/de-spreading, diversity processing for transmission/reception, interference cancellation, equalization, time and frequency synchronization, up-converting/down-converting, multiplexing/de-multiplexing and data transport to/from an external network (not shown).

In case of downlink, the BBU 110 compresses IQ data before transmission over the transport link 120 and the RRH 130 decompresses IQ data after the transmission. In case of uplink, the RRH 130 compresses IQ data before transmission over the transport link 120 and the BBU 110 decompresses IQ data after the transmission. In both cases, compressed data are sent over the transport link 120, such as CPRI, OBSAI. Similar to this scenario, this method can also be applied to JESD204B, where, for instance, the IQ data are transmitted between DAC/ADC and FPGA. For notation simplicity, the present disclosure focuses on the BBU-RRH scenario.

Figure 2:
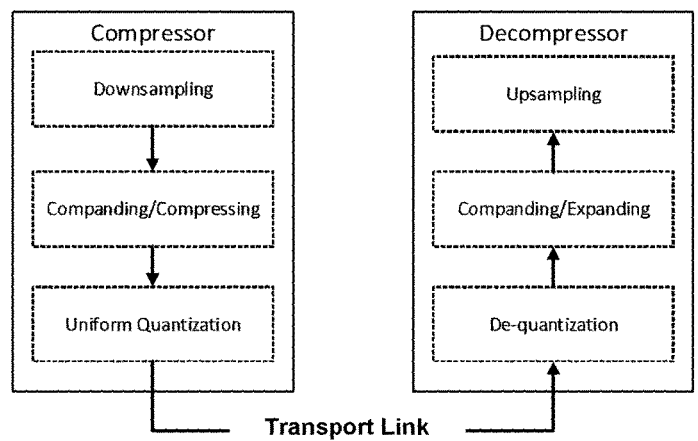
FIG. 2 is a schematic diagram illustrating an exemplary scheme proposed in the present disclosure.

FIG. 2 is a schematic diagram illustrating an exemplary scheme proposed in the present disclosure.

As shown in FIG. 2, the proposed scheme utilizes companding and uniform quantization in compression. That is, compared with the conventional IQ data compression scheme which employs non-uniform quantization, the proposal scheme utilizes companding and uniform quantization to realize the similar function. As an inversion operation, the corresponding decompression may operate correspondingly. It should be noted that companding at the compressor as shown relates to compressing, while companding at the de-compressor as shown relates to decompressing/expanding.

Figure 3:
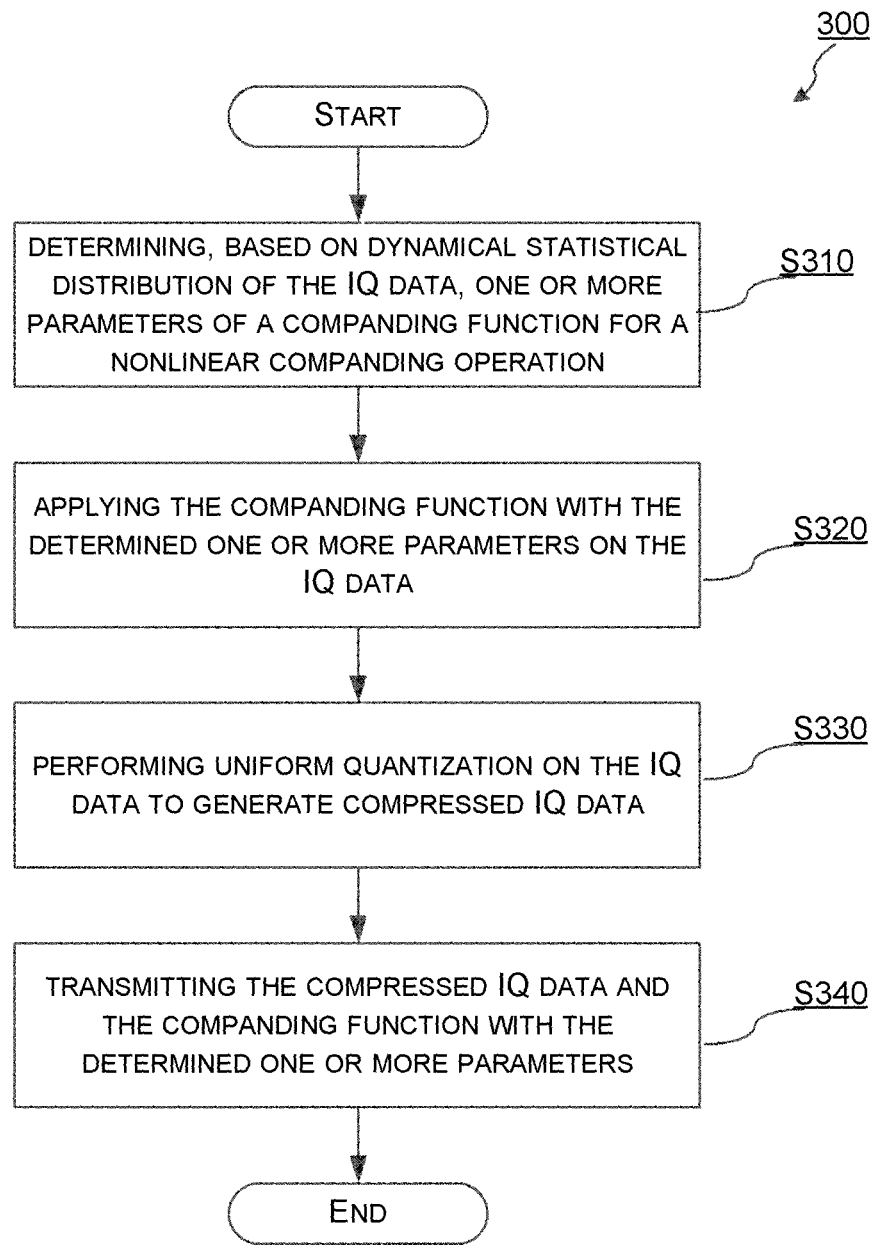
FIG. 3 shows a flowchart of a method 300 for compressing IQ data for high speed transport link according to the present disclosure.

FIG. 3 shows a flowchart of a method 300 for compressing IQ data for high speed transport link according to the present disclosure. For example, the high speed transport link may include CPRI, OBSAI, or JESD204B. The method 300 may be applied in both RRH and BBU as shown in FIG. 1. Of course, the present disclosure is not limited thereto, but may be applied to other appropriate entities, which have IQ data to send to respective counterparts, such as DAC/ADC or FPGA.

At step S310, one or more parameters of a companding function for a nonlinear companding operation are determined based on dynamical statistical distribution of the IQ data.

As an example, step S310 particularly includes determining the one or more parameters of the companding function by applying curve fitting. In this example, the curve fitting is made based on the dynamical statistical distribution of the IQ data.

At step S320, the companding function with the determined one or more parameters is applied on the IQ data.

At step S330, uniform quantization is performed on the IQ data to generate compressed IQ data.

At step S340, the compressed IQ data and the companding function with the determined one or more parameters are transmitted.

In an implementation, the companding function includes at least one of: μ-law, A-law, error function, tan h function, or logarithmic function.

In another implementation, the nonlinear companding operation includes a NLAST companding operation or a NLST companding operation.

Figure 4:
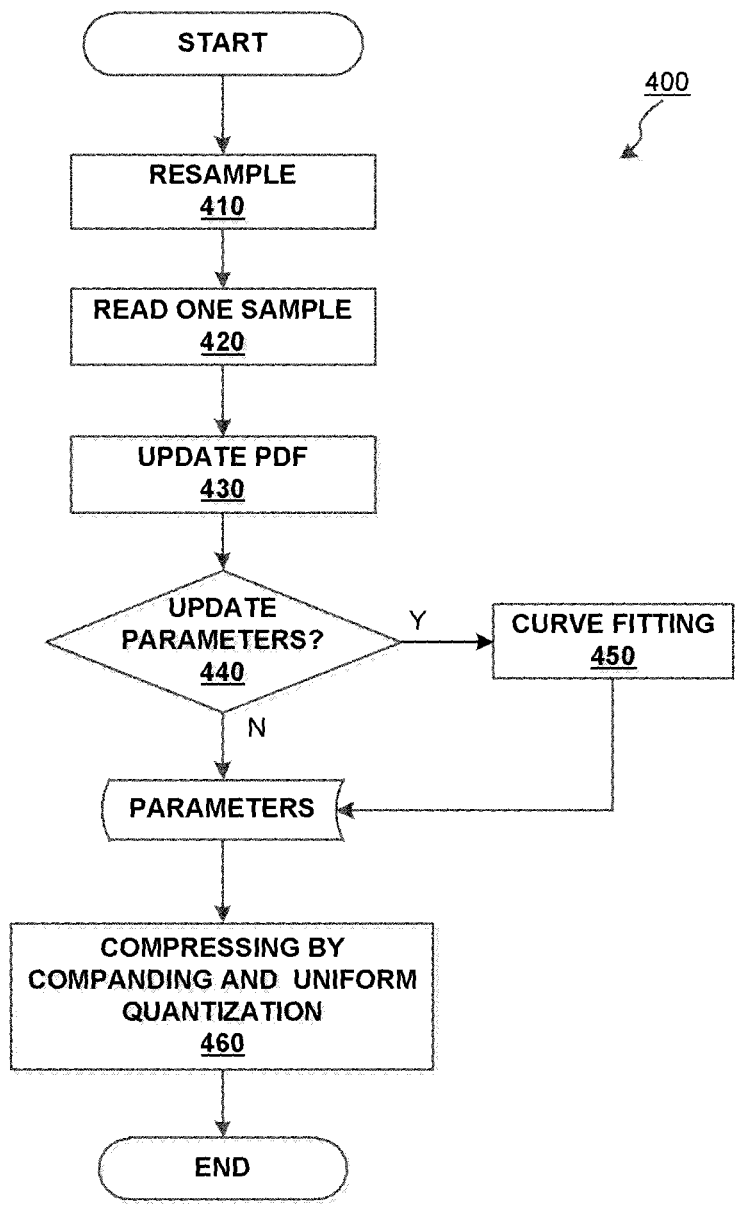
FIG. 4 shows a flowchart of an exemplary implementation of the method 300 in BBU according to the present disclosure.

FIG. 4 shows a flowchart of an exemplary implementation of the method 300 in BBU according to the present disclosure. For illustration purpose, the following description is made in the context of applying the method 300 to IQ data to be transmitted from BBU to RRH via a transport link such as CPRI. Of course, the present disclosure it not limited thereto.

As shown in FIG. 4, BBU re-samples the IQ data at step S410 and then reads one sample from the IQ data at step S420. Then, BBU updates Probability Distribution Function (PDF) at step S430 and determines whether it is needed to update the one or more parameters of the companding function based on the updated PDF at step S440. For example, if there is a significant change in the updated PDF compared with the previous PDF, BBU may determine that it is needed to update the one or more parameters of the companding function (Y branch of step S440). Then, the method proceeds to step S450, in which BBU determines the one or more parameters of the companding function by applying curve fitting, which is made based on the dynamical statistical distribution of the IQ data. Then, the method proceeds to step S460. If it is not needed to update the one or more parameters of the companding function, the previous one or more parameters of the companding function may be applied, and the method also proceeds to step S460. At step S460, BBU performs compression on the IQ data by applying the companding function with the determined/previous one or more parameters on the IQ data and performing uniform quantization on the IQ data, so as to generate compressed IQ data.

It can be seen from FIG. 4 that the compression according to present disclosure may be accomplished sample-by-sample. In view of this, the processing delay may be, e.g., 32.5 ns for 30.72M sample rate, and 52.1 ns for 19.2M sample rate.

It should be noted that FIG. 4 just focuses on procedures after an initial phase, in which one or more parameters of the companding function should be pre-determined or pre-configured.

In the following, descriptions will be made on how to obtain the one or more parameters of the companding function by applying curve fitting.

Figure 5:
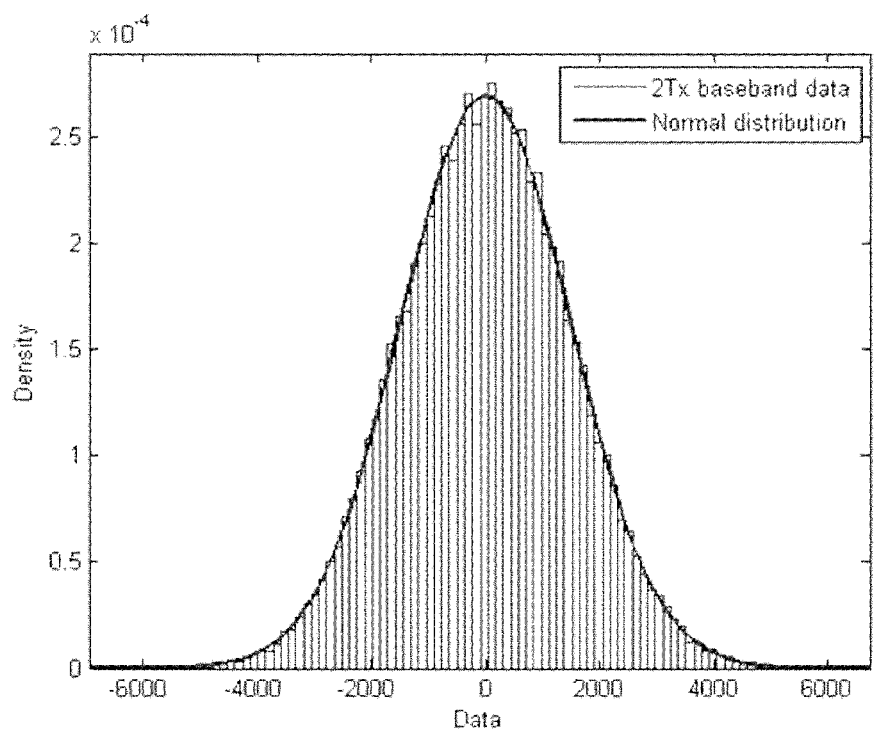
FIG. 5 illustrates an example IQ data distribution in one typical traffic scenario.
Figure 6:
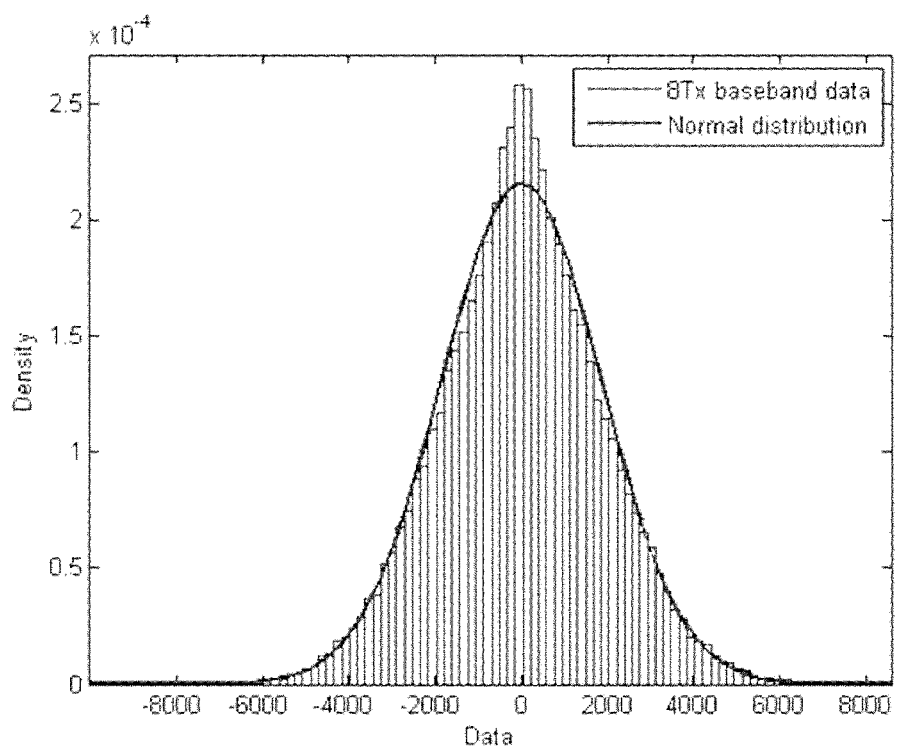
FIG. 6 illustrates an example IQ data distribution in another typical traffic scenario.

FIGS. 5 and 6 illustrate example IQ data distributions in two typical traffic scenarios, respectively. It is clearly shown that the distribution is approximate to normal distribution. From viewpoint of EVM, non-uniform quantization outperforms uniform quantization significantly because it exploits more bits for the data in high density area. Nevertheless, it is difficult to compute codebook and partitions for non-uniform quantization due to the high complexity of Lloyd-Max algorithm. Even if the codebook and partitions are given, conveying these two vectors from compressor to de-compressor is also inconvenient. These problems can be solved by proposed companding and curve fitting.

Figure 7:
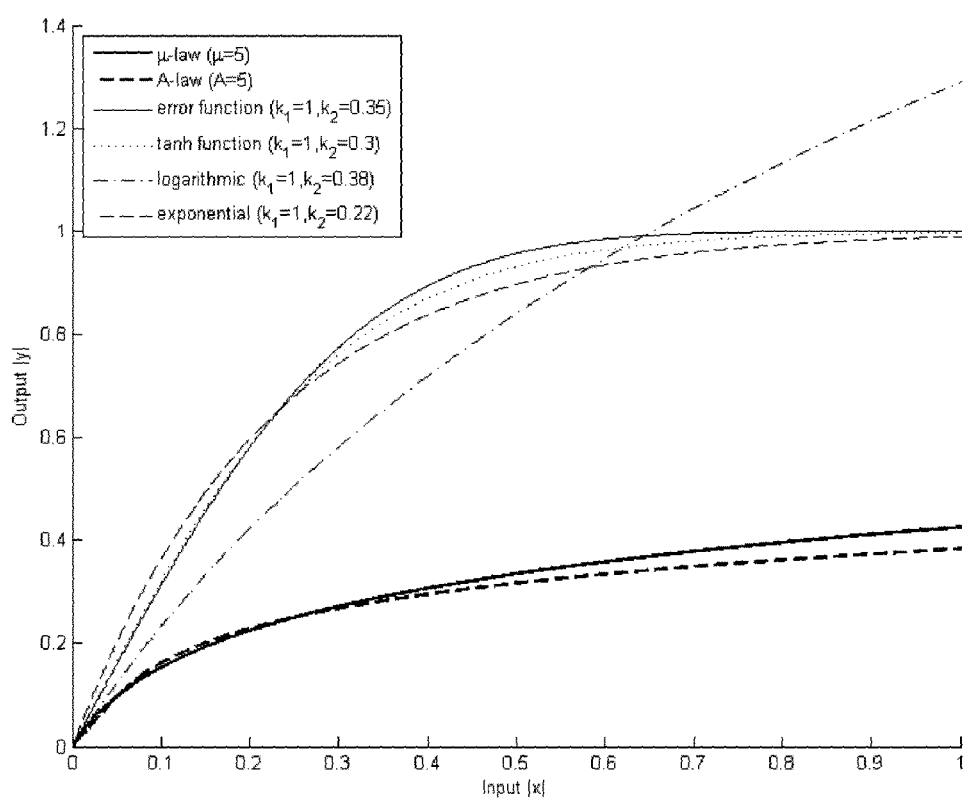
FIG. 7 depicts curves of some well-known companding functions with general parameters.

FIG. 7 depicts curves of some well-known companding functions with general parameters. These curves present different compression characters and can be used for a wide range of data statistical distribution. Functions of interest include, but are not limited to the following:

μ-law function $$x_\mu = \frac{V\log(1+\mu|x|/V)}{\log(1+\mu)}\text{sgn}(x) \qquad (1)$$

A-law function $$x_A = \begin{cases} \frac{A|x|}{1+\log A}\text{sgn}(x) & \text{for } 0 \le |x| \le \frac{V}{A} \\ \frac{V(1+\log(A|x|/V))}{1+\log A}\text{sgn}(x) & \text{for } \frac{V}{A} < |x| \le V \end{cases} \qquad (2)$$

error function $$x_{erf} = k_1 erf(x/k_2) \qquad (3)$$

tan h function $$x_{\tan h} = k_1 \tan h(x/k_2) \qquad (4)$$

logarithmic function $$x_{log} = k_1 \log(1+|x|/k_2)\text{sgn}(x) \qquad (5)$$

exponential function $$x_{exp} = (1 e^{-(|x|/k_2)})^{k_1}\text{sgn}(x) \qquad (6)$$

Figure 8:
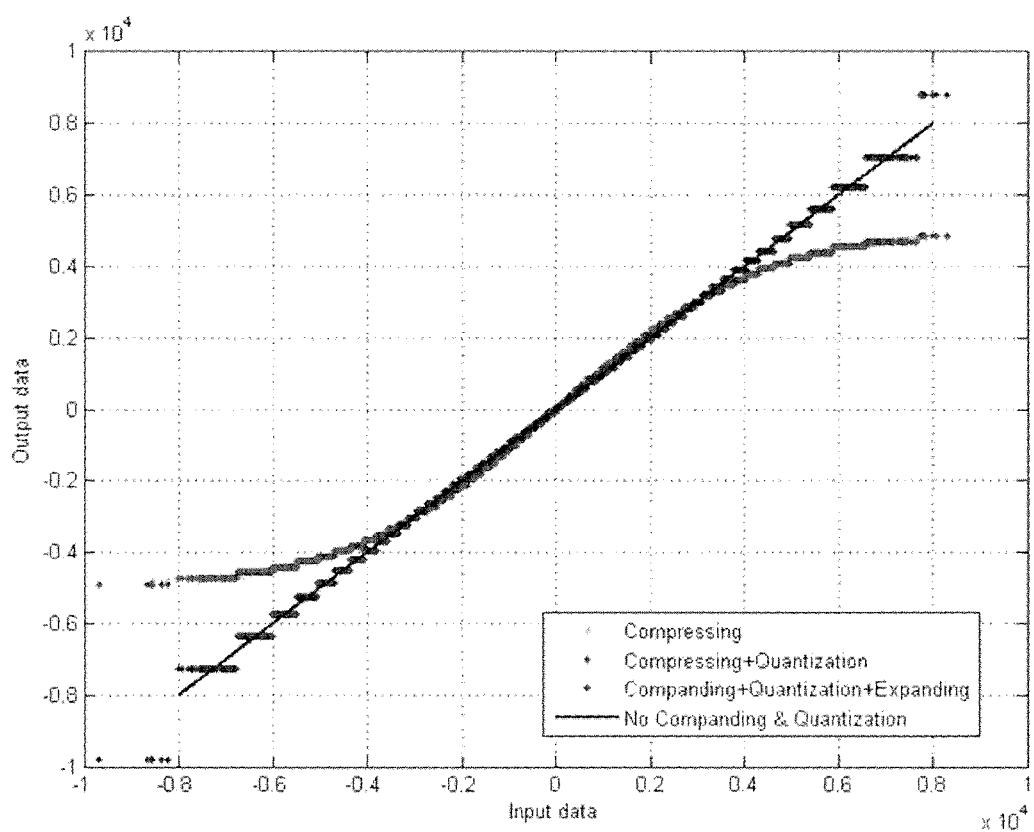
FIG. 8 shows approximate quantization of the optimal non-uniform quantization realized by error function companding.

FIG. 8 shows approximate quantization of the optimal non-uniform quantization realized by error function companding. This proves that the non-uniform quantization can be replaced by nonlinear companding and uniform quantization. Since the uniform quantization has no parameters (implicitly known to both compressor and de-compressor), and nonlinear companding has one or two parameters, the proposed methods have little information on signaling.

In an implementation, the present disclosure performs the compression on each dimension of IQ sample separately. Herein, N indicates bits before compression and Q indicates bits after compression. Considering the IQ data distribution as shown in FIG. 6 as an example, there are $2^Q$ segments and $2^Q+1$ partitions in the IQ data distribution. The axis of partition is defined as $L_i$, i=0, 1, ... $2^Q$, and the length of segment is defined as $\Delta_i$, =1, 2, ... $2^Q$. To avoid alias, we let segment i contain the value in set$[L_{i-1},L_i)$, clearly, $\Delta_i$ equals to $L_i-L_{i-1}$. Furthermore, $L_0$ and $L_{2^Q}$ corresponds to the minimum and maximum values of input data, i.e., $-2^{N-1}$ and $2^{N-1}-1$. $f(.)$ is used to represent the companding function, then the compressed partitions and segments can be expressed as:

$$\tilde{L}_i = f^{-1}(L_i), \text{ for } i=0,1, \ldots 2^Q \qquad (7)$$

$$\tilde{\Delta}_i = \tilde{L}_i - \tilde{L}_{i-1}, \text{ for } i=1, \ldots 2^Q \qquad (8)$$

Given distribution p(n), n=$-2^{N-1}$, ..., $2^{N-1}-1$, the distortion of quantization q can be written as:

$$D(q) = \sum_{i=1}^{2^Q}\left(\sum_{n=L_{i-1}}^{L_i-1} p(n)\right)\tilde{\Delta}_i^3/12 \qquad (9)$$

By minimizing D(q), the optimal parameter for the companding function can be obtained. Considering uniform partitions, i.e., $\Delta_i=(L_{2^Q}-L_0)/2^Q=2^{N-Q}$, i=1, 2, ... $2^Q$, the generated non-uniform partitions are controlled by the companding function and its parameters.

Essentially, the resolution relating to p(n) and $\tilde{\Delta}_i$ can be compromised to simplify the calculation. For example, we can estimate the possibility of IQ data with $2^K$ bins, where K is a predefined system parameter and Q<K<N. Prior to computing D(q), segment length $\tilde{\Delta}_i$ will be approximated to the adjacent bins. If the value K is chosen properly, the complexity can be reduced with slight impact on the performance. The optimal parameters are easily obtained by searching the reasonable values.

Figure 9:
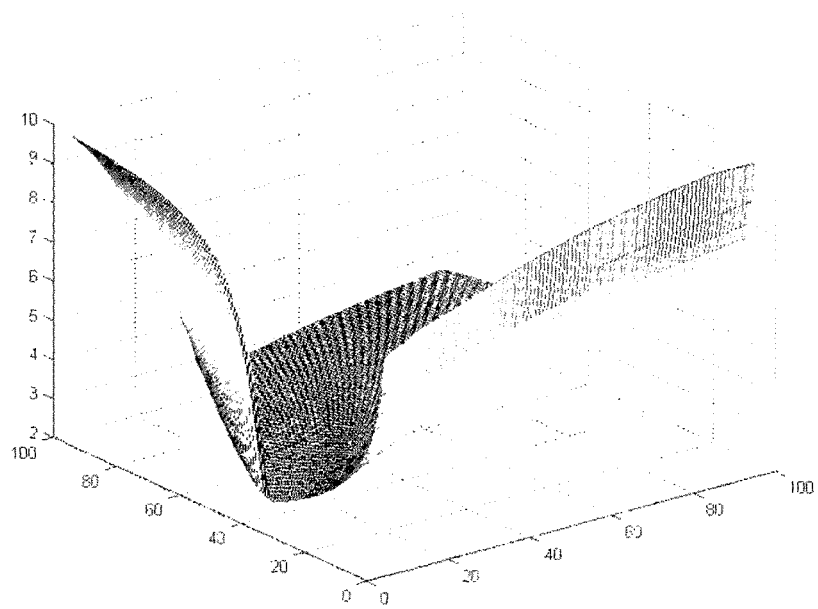
FIG. 9 is a curve diagram illustrating optimal parameters of logarithmic function applied for high traffic load scenario.

FIG. 9 shows the resultant D(q) with respect to different parameters of logarithmic function, in which the IQ data has the same distribution as shown in FIG. 6. It is worth mentioning that AGC, also known as scaling, can be implemented with companding straightforwardly, where the scaling factor is absorbed by $k_2$.

Figure 10:
FIG. 10 illustrates EVM comparison for 2 AxC Quadrature Phase Shift Keying (QPSK) low traffic.
Figure 11:
FIG. 11 illustrates EVM comparison for 8 AxC 64 Quadrature Amplitude Modulation (QAM) high traffic.

FIGS. 10 and 11 give the EVM comparisons between proposed method and uniform and non-uniform (Lloyd-Max) quantization. It is seen that uniform quantization has worst performance. The proposed scheme has similar results as Lloyd-Max algorithm, although in which AGC is used independently to improve the performance. However, it should be noted that AGC and Lloyd-Max have many information to be conveyed from compressor to de-compressor, such as scaling factor, partitions and codebook. These information are so big that cannot be sent via control plane, therefore reducing the actually transmission rate. On the contrary, on strength of companding using curve fitting, the proposed scheme has few parameters to be sent. For this reason, they can exploit control plane to send and do not affect data plane. Due to this, the present disclosure can easily adapt to different statistical distributions of IQ data.

Figure 12:
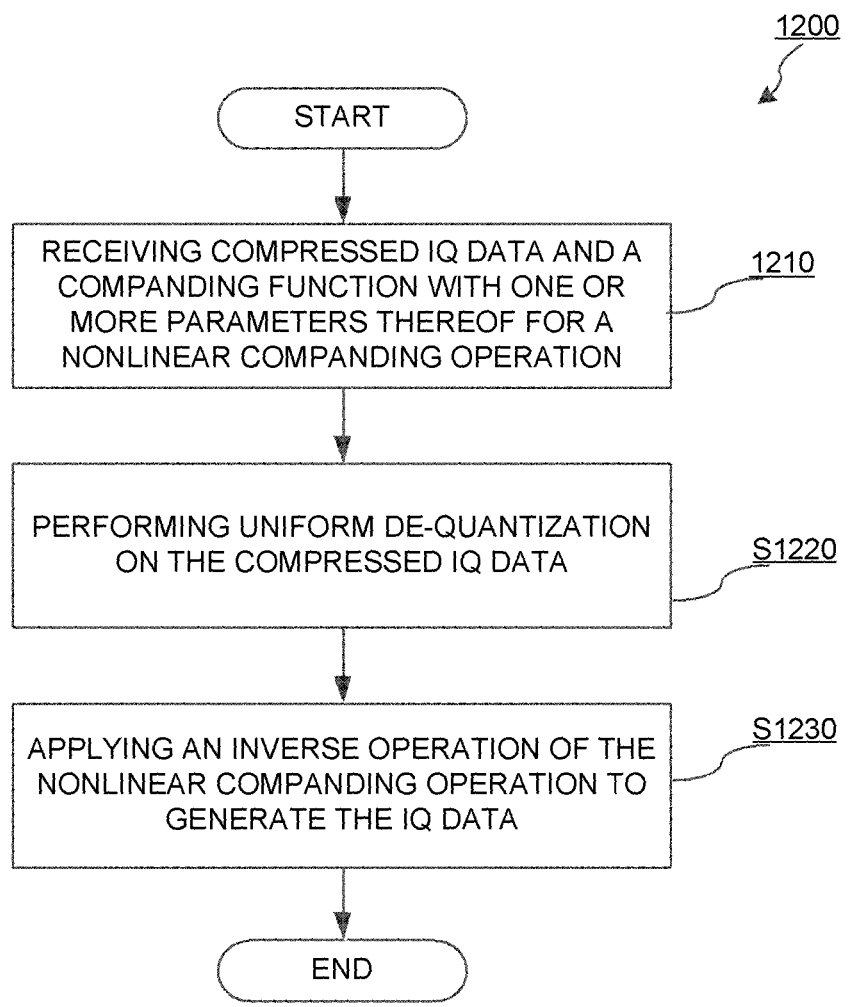
FIG. 12 is a flowchart of a method 1200 for decompressing compressed IQ data for high speed transport link according to the present disclosure.

FIG. 12 shows a flowchart of a method 1200 for decompressing compressed IQ data for high speed transport link according to the present disclosure. For example, the high speed transport link may include CPRI, OBSAI, or JESD204B. The method 1200 may be an inverse process of the method 300 as shown in FIG. 3, and may be applied in both RRH and BBU as shown in FIG. 1. Of course, the present disclosure is not limited thereto, but may be applied to other appropriate entities, which have IQ data to send to respective counterparts, such as DAC/ADC or FPGA.

At step S1210, compressed IQ data and a companding function with one or more parameters thereof for a nonlinear companding operation is received. The one or more parameters may be determined based on dynamical statistical distribution of IQ data from which the compressed IQ data are originated.

At step S1220, uniform de-quantization is performed on the compressed IQ data.

At step S1230, an inverse operation of the nonlinear companding operation is applied to generate the IQ data.

As an example, the companding function may include at least one of: μ-law, A-law, error function, tan h function, or logarithmic function.

As another example, the nonlinear companding operation includes a NLAST companding operation or a NLST companding operation.

Figure 13:
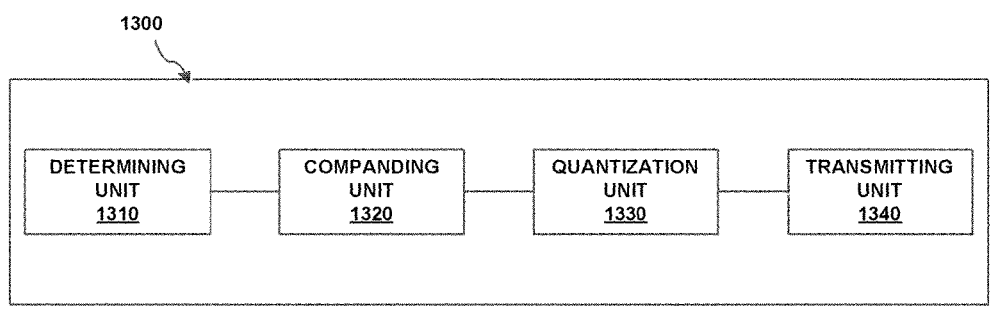
FIG. 13 is a diagram illustrating an example structure of a device 1300 according to present disclosure.

FIG. 13 is a schematic block diagram of a device 1300 for compressing IQ data for high speed transport link according to the present disclosure. For example, the high speed transport link may include CPRI, OBSAI, or JESD204B. The device 1300 may be a BBU or a RRH as shown in FIG. 1. Of course, the device 1300 is not limited thereto, but may be other appropriate entities, which have IQ data to send to respective counterparts, such as DAC/ADC or FPGA.

As shown in FIG. 13, the device 1300 includes a determining unit 1310, a companding unit 1320, a quantization unit 1330, and a transmitting unit 1340.

The determining unit 1310 is configured to determine, based on dynamical statistical distribution of the IQ data, one or more parameters of a companding function for a nonlinear companding operation. For example, the nonlinear companding operation may include a NLAST companding operation or a NLST companding operation.

In an implementation, the determining unit 1310 may be further configured to determine the one or more parameters of the companding function by applying curve fitting. In this case, the curve fitting is made based on the dynamical statistical distribution of the IQ data.

The companding unit 1320 is configured to apply the companding function with the determined one or more parameters on the IQ data. For example, the companding function may include at least one of: µ-law, A-law, error function, tan h function, or logarithmic function.

The quantization unit 1330 is configured to perform uniform quantization on the IQ data to generate compressed IQ data.

The transmitting unit 1340 is configured to transmit the compressed IQ data and the companding function with the determined one or more parameters.

Figure 14:
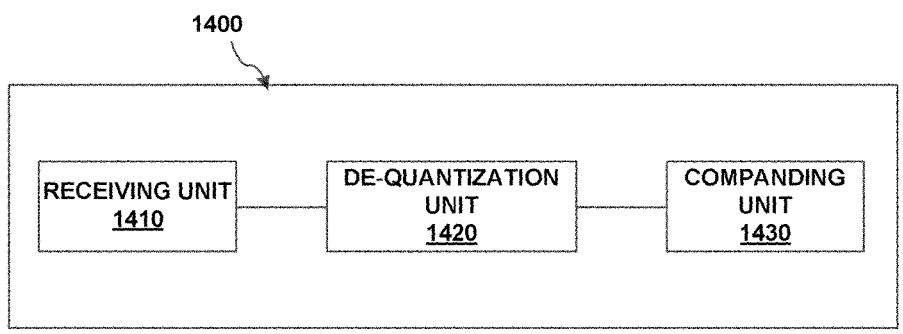
FIG. 14 is a diagram illustrating an example structure of a device 1400 according to present disclosure.

FIG. 14 is a schematic block diagram of a device 1400 for decompressing compressed IQ data for high speed transport link according to the present disclosure. The device 1400 is substantially a counterpart of the device 1300, and performs an inversion operation (i.e., decompression) of the compression performed by the device 1300.

As shown in FIG. 14, the device 1400 includes a receiving unit 1410, a de-quantization unit 1420, and a companding unit 1430.

The receiving unit is configured to receive compressed IQ data and a companding function with one or more parameters thereof for a nonlinear companding operation. The one or more parameters are determined based on dynamical statistical distribution of IQ data from which the compressed IQ data are originated.

The de-quantization unit 1420 is configured to perform uniform de-quantization on the compressed IQ data.

The companding unit 1430 is configured to apply an inverse operation of the nonlinear companding operation to generate the IQ data.

Figure 15:
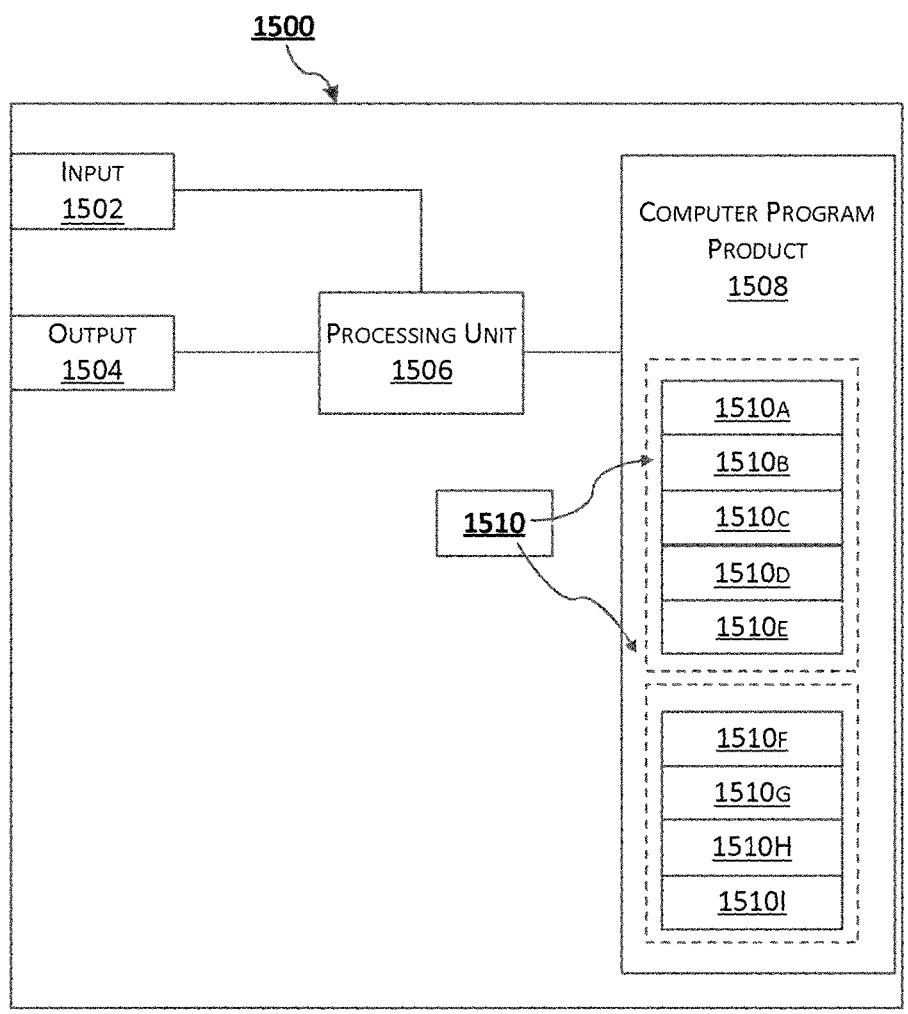
FIG. 15 schematically shows an embodiment of an arrangement 1500 which may be used in the device 1300 or the device 1400 according to the present disclosure.

FIG. 15 schematically shows an embodiment of an arrangement 1500 which may be used in the device 1300 or the device 1400 according to the present disclosure. As an example, the arrangement 1500 may be used in BBU and/or RRH for facilitating IQ data transmission between BBU and RRH. As another example, the arrangement 1500 may be used in DAC/ADC and/or FPGA for facilitating IQ data transmission between DAC/ADC and FPGA. Comprised in the arrangement 1500 are here a processing unit 1506, e.g., with a Digital Signal Processor (DSP). The processing unit 1506 may be a single unit or a plurality of units to perform different actions of procedures described herein. The arrangement 1500 may also comprise an input unit 1502 for receiving signals from other entities, and an output unit 1504 for providing signal(s) to other entities. The input unit and the output unit may be arranged as an integrated entity or as illustrated in the example of FIG. 13 or FIG. 14.

Furthermore, the arrangement 1500 may comprise at least one computer program product 1508 in the form of a non-volatile or volatile memory, e.g., an Electrically Erasable Programmable Read-Only Memory (EEPROM), a flash memory and a hard drive. The computer program product 1508 comprises a computer program 1510, which comprises code/computer readable instructions, which when executed by the processing unit 1506 in the arrangement 1500 causes the arrangement 1500 and/or the device 1300 or the device 1400 in which it is comprised to perform the actions, e.g., of the procedure described earlier in conjunction with FIG. 3 or FIG. 12.

The computer program 1510 may be configured as a computer program code structured in computer program modules 1510A 1510E or 1510F 15101.

Hence, in an exemplifying embodiment when the arrangement 1500 is used in the device 1300, the code in the computer program of the arrangement 1500 includes a determining module 1510A, for determining, based on dynamical statistical distribution of the IQ data, one or more parameters of a companding function for a nonlinear companding operation. The code in the computer program 1510 further includes a companding module 1510B, for applying the companding function with the determined one or more parameters on the IQ data. The code in the computer program 1510 further includes a quantization module 1510C, for performing uniform quantization on the IQ data to generate compressed IQ data. The code in the computer program 1510 further includes a transmitting module 1510D, for transmitting the compressed IQ data and the companding function with the determined one or more parameters. The code in the computer program 1510 may comprise further modules, illustrated as module 1510E, e.g. for controlling and performing other related procedures associated with the device 1300's operations.

In another exemplifying embodiment when the arrangement 1500 is used in the device 1400, the code in the computer program of the arrangement 1500 includes a receiving module 1510F, for receiving compressed IQ data and a companding function with one or more parameters thereof for a nonlinear companding operation, wherein the one or more parameters are determined based on dynamical statistical distribution of IQ data from which the compressed IQ data are originated. The code in the computer program further includes a de-quantization module 1510G, for performing uniform de-quantization on the compressed IQ data. The code in the computer program further includes a companding unit 1510H, for applying an inverse operation of the nonlinear companding operation to generate the IQ data. The code in the computer program 1510 may comprise further modules, illustrated as module 15101, e.g. for controlling and performing other related procedures associated with the device 1400's operations.

The computer program modules could essentially perform the actions of the flow illustrated in FIG. 3, to emulate the device 1300, or the actions of the flow illustrated in FIG. 12, to emulate the device 1400. In other words, when the different computer program modules are executed in the processing unit 1506, they may correspond, e.g., to the units 1310-1340 of FIG. 13 or to the units 1410-1430 of FIG. 14.

Although the code means in the embodiments disclosed above in conjunction with FIG. 15 are implemented as computer program modules which when executed in the processing unit causes the device to perform the actions described above in conjunction with the figures mentioned above, at least one of the code means may in alternative embodiments be implemented at least partly as hardware circuits.

The processor may be a single CPU (Central processing unit), but could also comprise two or more processing units. For example, the processor may include general purpose microprocessors; instruction set processors and/or related chips sets and/or special purpose microprocessors such as Application Specific Integrated Circuit (ASICs). The processor may also comprise board memory for caching purposes. The computer program may be carried by a computer program product connected to the processor. The computer program product may comprise a computer readable medium on which the computer program is stored. For example, the computer program product may be a flash memory, a Random-access memory (RAM), a Read-Only Memory (ROM), or an EEPROM, and the computer program modules described above could in alternative embodiments be distributed on different computer program products in the form of memories within the BBU or RRH (or BS in which the BBU or RRH is comprised).

The present disclosure is described above with reference to the embodiments thereof. However, those embodiments are provided just for illustrative purpose, rather than limiting the present disclosure. The scope of the disclosure is defined by the attached claims as well as equivalents thereof. Those skilled in the art can make various alternations and modifications without departing from the scope of the disclosure, which all fall into the scope of the disclosure.

What is claimed is:

1. A method for compressing In-phase and Quadrature (IQ) data for a high speed transport link, the method comprising:
    determining, based on dynamical statistical distribution of the IQ data, one or more parameters of a companding function for a nonlinear companding operation;
    applying the companding function with the determined one or more parameters on the IQ data;
    in response to applying the companding function with the determined one or more parameters on the IQ data, performing uniform quantization on the IQ data to generate compressed IQ data; and
    transmitting the compressed IQ data and the companding function with the determined one or more parameters,
    wherein determining the one or more parameters of the companding function comprises:
        determining the one or more parameters of the companding function based on a comparison between a first probability distribution function and a second probability distribution function, wherein the first probability distribution function is associated with the IQ data before being resampled and the second probability distribution function is associated with the IQ data after being resampled, and
        in response to determining the one or more parameters of the companding function, applying curve fitting to minimize distortion of quantization, wherein the curve fitting is applied based on the dynamical statistical distribution of the IQ data.

2. The method according to claim 1, wherein the companding function includes at least one of: μ-law, A-law, an error function, a tan h function, or a logarithmic function.

3. The method according to claim 1, wherein the nonlinear companding operation includes a nonlinear asymmetrical transform (NLAST) companding operation or a nonlinear symmetrical transform (NLST) companding operation.

4. The method according to claim 1, wherein the method is applied in a Baseband Unit (BBU) or a Remote Radio Head (RRH).

5. The method according to claim 1, wherein the high speed transport link comprises at least one of: Common Public Radio Interface (CPRI), Open Base Station Architecture Initiative (OBSAI), or JESD204B.

6. A method for decompressing compressed In-phase and Quadrature (IQ) data for a high speed transport link, the method comprising:
    receiving the compressed IQ data and a companding function with one or more parameters thereof for a nonlinear companding operation, wherein the one or more parameters are determined based on dynamical statistical distribution of IQ data from which the compressed IQ data originates;
    performing uniform de-quantization on the compressed IQ data; and
    applying an inverse operation of the nonlinear companding operation to generate the IQ data,
    wherein the one or more parameters of the companding function are determined by:
        determining the one or more parameters of the companding function based on a comparison between a first probability distribution function and a second probability distribution function, wherein the first probability distribution function is associated with the IQ data before being resampled and the second probability distribution function is associated with the IQ data after being resampled, and
        in response to determining the one or more parameters of the companding function, applying curve fitting to minimize distortion of quantization, wherein the curve fitting is applied based on the dynamical statistical distribution of the IQ data.

7. The method according to claim 6, wherein the companding function includes at least one of: μ-law, A-law, an error function, a tan h function, or a logarithmic function.

8. The method according to claim 6, wherein the nonlinear companding operation includes a nonlinear asymmetrical transform (NLAST) companding operation or a nonlinear symmetrical transform (NLST) companding operation.

9. The method according to claim 6, wherein the method is applied in a Baseband Unit (BBU) or a Remote Radio Head (RRH).

10. The method according to claim 6, wherein the high speed transport link comprises at least one of: Common Public Radio Interface (CPRI), Open Base Station Architecture Initiative (OBSAI), or JESD204B.

11. A device for compressing In-phase and Quadrature (IQ) data for a high speed transport link, the device comprising one or more processors operable to:
    determine, based on dynamical statistical distribution of the IQ data, one or more parameters of a companding function for a nonlinear companding operation;
    apply the companding function with the determined one or more parameters on the IQ data;
    in response to the application of the companding function with the determined one or more parameters on the IQ data, perform uniform quantization on the IQ data to generate compressed IQ data; and
    transmit the compressed IQ data and the companding function with the determined one or more parameters, wherein the device comprising the one or more processors is further operable to:
  determine the one or more parameters of the companding function based on a comparison between a first probability distribution function and a second probability distribution function, wherein the first probability distribution function is associated with the IQ data before being resampled and the second probability distribution function is associated with the IQ data after being resampled, and
  in response to the determination of the one or more parameters of the companding function, apply curve fitting to minimize distortion of quantization, wherein the curve fitting is applied based on the dynamical statistical distribution of the IQ data.

12. The device according to claim 11, wherein the companding function includes at least one of: μ-law, A-law, error function, a tan h function, or a logarithmic function.

13. The device according to claim 11, wherein the nonlinear companding operation includes a nonlinear asymmetrical transform (NLAST) companding operation or a nonlinear symmetrical transform (NLST) companding operation.

14. The device according to claim 11, wherein the device is a Baseband Unit (BBU) or a Remote Radio Head (RRH).

15. The device according to claim 11, wherein the high speed transport link comprises at least one of: Common Public Radio Interface (CPRI), Open Base Station Architecture Initiative (OBSAI), or JESD204B.

16. A device for decompressing compressed In-phase and Quadrature (IQ) data for a high speed transport link, the device comprising one or more processors operable to:
  receive the compressed IQ data and a companding function with one or more parameters thereof for a nonlinear companding operation, wherein the one or more parameters are determined based on dynamical statistical distribution of IQ data from which the compressed IQ data originates;
  perform uniform de-quantization on the compressed IQ data; and
  apply an inverse operation of the nonlinear companding operation to generate the IQ data,
  wherein the device comprising the one or more processors is further operable to:
    determine the one or more parameters of the companding function based on a comparison between a first probability distribution function and a second probability distribution function, wherein the first probability distribution function is associated with the IQ data before being resampled and the second probability distribution function is associated with the IQ data after being resampled, and
    in response to the determination of the one or more parameters of the companding function, apply curve fitting to minimize distortion of quantization, wherein the curve fitting is applied based on the dynamical statistical distribution of the IQ data.

17. The device according to claim 16, wherein the companding function includes at least one of: μ-law, A-law, an error function, a tan h function, or a logarithmic function.

18. The device according to claim 16, wherein the nonlinear companding operation includes a nonlinear asymmetrical transform (NLAST) companding operation or a nonlinear symmetrical transform (NLST) companding operation.

* * * * *